United States Patent
Hu et al.

(10) Patent No.: US 9,196,211 B2
(45) Date of Patent: Nov. 24, 2015

(54) SHIFT REGISTER UNIT, GATE DRIVING CIRCUIT AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventors: Zuquan Hu, Beijing (CN); Guolei Wang, Beijing (CN); Rui Ma, Beijing (CN); Ming Hu, Beijing (CN)

(73) Assignees: BOE Technology Group Co., Ltd., Beijing (CN); Hefei BOE Optoelectronics Technology Co., Ltd., Hefei Anhui (CN)

( * ) Notice: Subject to any disclaimer, the term of this patent is extended or adjusted under 35 U.S.C. 154(b) by 14 days.

(21) Appl. No.: 14/105,402

(22) Filed: Dec. 13, 2013

(65) Prior Publication Data
US 2014/0168044 A1   Jun. 19, 2014

(30) Foreign Application Priority Data
Dec. 14, 2012   (CN) .......................... 2012 1 0546671

(51) Int. Cl.
G09G 3/36 (2006.01)
G11C 19/28 (2006.01)

(52) U.S. Cl.
CPC ............. G09G 3/3696 (2013.01); G11C 19/28 (2013.01); G11C 19/287 (2013.01); G09G 2310/0286 (2013.01)

(58) Field of Classification Search
CPC ...... G11C 19/28; G11C 19/184; G11C 19/00; G09G 2310/0286; G09G 3/3677; G09G 2300/0842; G09G 3/3233; G09G 2300/0819; G09G 2320/043; G09G 3/30; G09G 3/3688; G09G 3/3648; G09G 2310/027
USPC ........................ 345/100, 80; 377/64; 327/108
See application file for complete search history.

(56) References Cited

U.S. PATENT DOCUMENTS

| 2007/0104307 | A1* | 5/2007 | Kim et al. ........................ 377/64 |
| 2008/0219401 | A1* | 9/2008 | Tobita ............................. 377/79 |
| 2009/0167668 | A1 | 7/2009 | Kim |
| 2009/0256794 | A1 | 10/2009 | Jang et al. |

(Continued)

FOREIGN PATENT DOCUMENTS

| CN | 101477836 A | 7/2009 |
| CN | 101562046 A | 10/2009 |

OTHER PUBLICATIONS

Extended European Search Report issued by the European Patent Office for International Application No. 13197075.8 on Mar. 31, 2014, 8 pages.

(Continued)

Primary Examiner — MD Saiful A Siddiqui

(57) ABSTRACT

Embodiments of the present disclosure relate to the field of display technique. Provided are a shift register unit, a gate driving circuit and a display device capable of reducing influence of the gate bias of the pull-down transistor and improving the stability of the shift register unit. The shift register unit comprises a first pull-up module, a first scanning module, a control module, a first pull-down module and a second pull-down module. The embodiments of the present disclosure can achieve a gate driving scanning from top to bottom or from bottom to top.

19 Claims, 7 Drawing Sheets

(56) References Cited

U.S. PATENT DOCUMENTS

2011/0012823 A1    1/2011  Tsai et al.
2013/0148775 A1*   6/2013  Shin et al. ................. 377/69

OTHER PUBLICATIONS

First Office Action (Chinese Language) from State Intellectual Property Office of the People's Republic of China in Chinese Application No. 201210546671.9, issued Feb. 27, 2015; 11 pages.

English translation First Office Action from State Intellectual Property Office of the People's Republic of China in Chinese Application No. 201210546671.9, issued Feb. 27, 2015; 13 pages.

English Abstract of Chinese Patent Application No. CN101477836A (listed above); 1 page.

English Abstract of Chinese Patent Application No. CN101562046A (listed above); 2 pages.

* cited by examiner

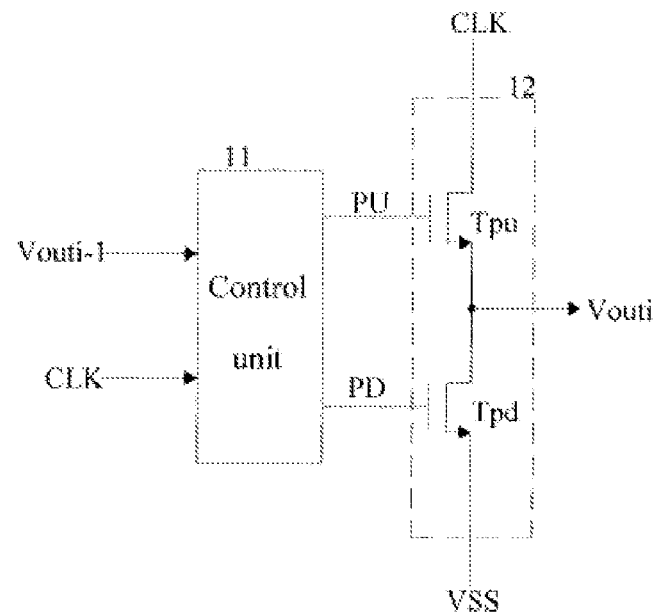
Fig. 1 - Prior Art
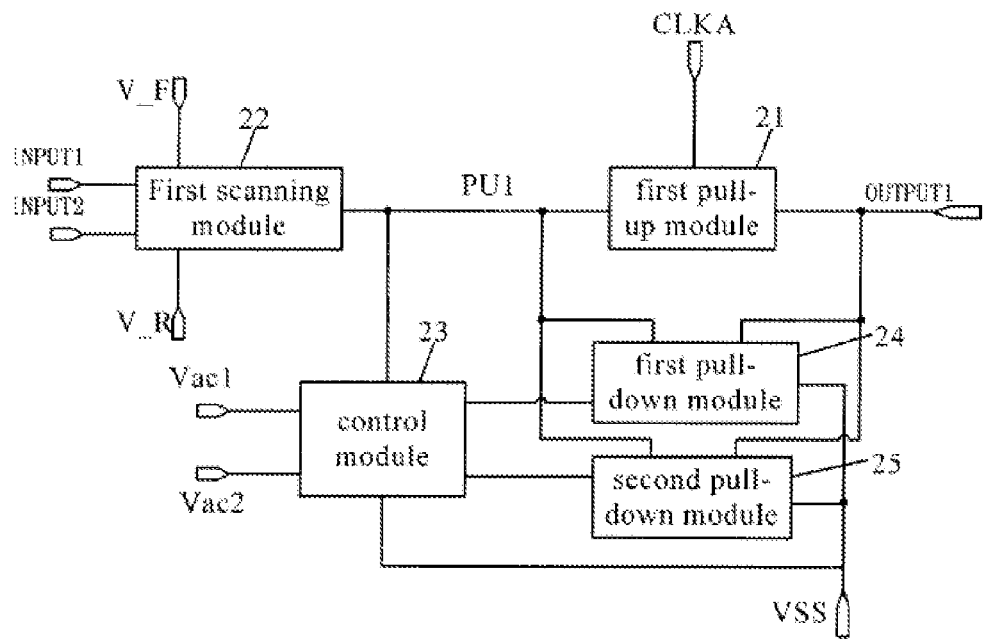
Fig. 2

SHIFT REGISTER UNIT, GATE DRIVING CIRCUIT AND DISPLAY DEVICE

CROSS REFERENCE TO RELATED APPLICATIONS

This application claims priority from Chinese National Application No. 201210546671.9 filed on Dec. 14, 2012, the contents of which are incorporated herein by reference.

TECHNICAL FIELD OF THE DISCLOSURE

The present disclosure relates to the field of display technique, particularly to a shift register unit, a gate driving circuit and a display device.

BACKGROUND

With the development of display technology, liquid crystal displays have been widely used in a variety of display areas, including home, public places, offices, personal electronics products and etc. A liquid crystal display panel mainly comprises a liquid crystal cell formed by an array substrate and a color filter substrate, a polarizing plate and a backlight module and etc. A great number of Thin Film Transistors (TFTs) are formed at intersections of gate lines and data lines, wherein a gate line controls a TFT to be turned on or turned off. When a TFT is turned on, a pixel electrode is charged or discharged through a data line, and a magnitude of a voltage applied to the liquid crystal molecules is controlled, so that the light through the liquid crystal molecules can display different grayscales. A circuit for driving gates is called a gate driving circuit, which sequentially outputs a scanning signal to the gate lines, wherein the scan signal is normally generated by a shift register. Because of different requirements on a display device, sometimes it is necessary for the display device to achieve a reverse display effect, which requires a shift register as a gate driving circuit having a bidirectional scanning function.

A common structure of an existing shift register unit for bidirectional scanning is illustrated in FIG. 1. The structure mainly comprises: a control unit 11 comprising inside a specific design for a forward scanning and a reverse scanning of the shift register unit, and a output unit 12 mainly comprising a pull-up transistor Tpu and a pull-down transistor Tpd, wherein gates of the pull-up transistor Tpu and the pull-down transistor Tpd are connected to control nodes PU and PD of the control unit 11 respectively, a drain of the pull-up transistor Tpu receives a clock signal CLK, and a source of the pull-down transistor Tpd is connected to a low level voltage terminal VSS. The control unit 11 is connected to an output terminal Vouti-1 of a previous stage shift register unit and receives the clock signal CLK. When receiving an output signal from the output terminal Vouti-1 of the previous stage shift register unit, the control unit 11 allows the node PU to be charged so as to turn on the pull-up transistor Tpu and simultaneously allows the node PD to be discharged so as to turn off the pull-down transistor Tpd; when the clock signal CLK is at a high level, the clock signal CLK at the high level is output from an output terminal Vouti via the transistor Tpu; in addition, when the clock signal CLK is at a low level, the control unit 11 allows the node PU to be discharged and the node PD to be charged simultaneously, and a low level of VSS is output from the output terminal Vouti via the transistor Tpd.

Such a shift register unit for bidirectional scanning has the following defect: the threshold voltage of the pull-down transistor Tpd drifts due to a DC voltage bias, which has an adverse influence on stability of the shift register unit seriously and affects quality of a product including the same.

SUMMARY

In embodiments of the present disclosure, there are provided a shift register unit, a gate driving circuit and a display device capable of reducing influence of the gate bias of the pull-down transistor and improving the stability of the shift register unit.

For achieving the above purpose, the embodiments of the present disclosure employ the following technical solutions.

According to one aspect of the embodiments of the present disclosure, there is provided a shift register unit comprising a first pull-up module, a first scanning module, a control module, a first pull-down module and a second pull-down module; wherein the first pull-up module receives a first clock signal, is connected to a first control node and a first signal output terminal, and is used for pulling up a signal output from the first signal output terminal to a high level under the control of the first scanning module and the first clock signal;

the first scanning module receives a first scanning signal and a second scanning signal, is connected to a first signal input terminal, a second signal input terminal and the first control node, and is used for determining a scanning direction under the control of the first scanning signal and the second scanning signal and controlling a potential at the first control node according to signals input from the first input terminal and the second signal input terminal;

the control module receives a first Alternating Current (AC) signal and a second AC signal, is connected to the first control node, the first pull-down module, the second pull-down module and a voltage terminal, and is used for controlling the first pull-down module and the second pull-down module according to the first AC signal and the second AC signal; and the first pull-down module and the second pull-down module are further connected to the first control node, the first signal output terminal and the voltage terminal, and are used for pulling down a signal output from the first signal output terminal alternately under the control of the control module.

According to another aspect of the embodiments of the present disclosure, there is provided a gate driving circuit comprising a plurality of stages of shift register units as described above;

except a zeroth stage of shift register unit, the first signal output terminal of each stage of shift register unit is connected to the second signal input terminal of an adjacent previous stage of shift register unit;

except a last stage of shift register unit, the first signal output terminal of each stage of shift register unit is connected to the first signal input terminal of an adjacent next stage of shift register unit.

According to still another aspect of the embodiments of the present disclosure, there is provided a display device comprising the gate driving circuit as described above.

The shift register unit, the gate driving circuit and the display device provided in the embodiments of the present disclosure can achieve the purpose for controlling the first pull-down module and the second pull-down module to operate alternately by two AC signals during two adjacent frame periods. Thus, the influence of the gate bias of each of the pull-down modules in the shift register unit can be decreased effectively, and the stability of the shift register unit can be improved.

BRIEF DESCRIPTION OF THE DRAWINGS

In order to illustrate the technical solutions in the embodiments of the present disclosure or in the prior art, a brief introduction will be given to the accompanying drawings used for describing the embodiments of the present disclosure or the prior art. Obviously, the accompanying drawings described as below are only for illustrating some of the embodiments of the present disclosure, and those skilled in the art can obtain other accompanying drawings from the drawings described without paying any inventive labor.

FIG. 1 is a schematic diagram for illustrating a structure of a shift register unit for bidirectional scanning in the prior art;

FIG. 2 is a schematic diagram for illustrating a structure of a shift register unit provided in the embodiments of the present disclosure;

DETAILED DESCRIPTION

Figure 3:
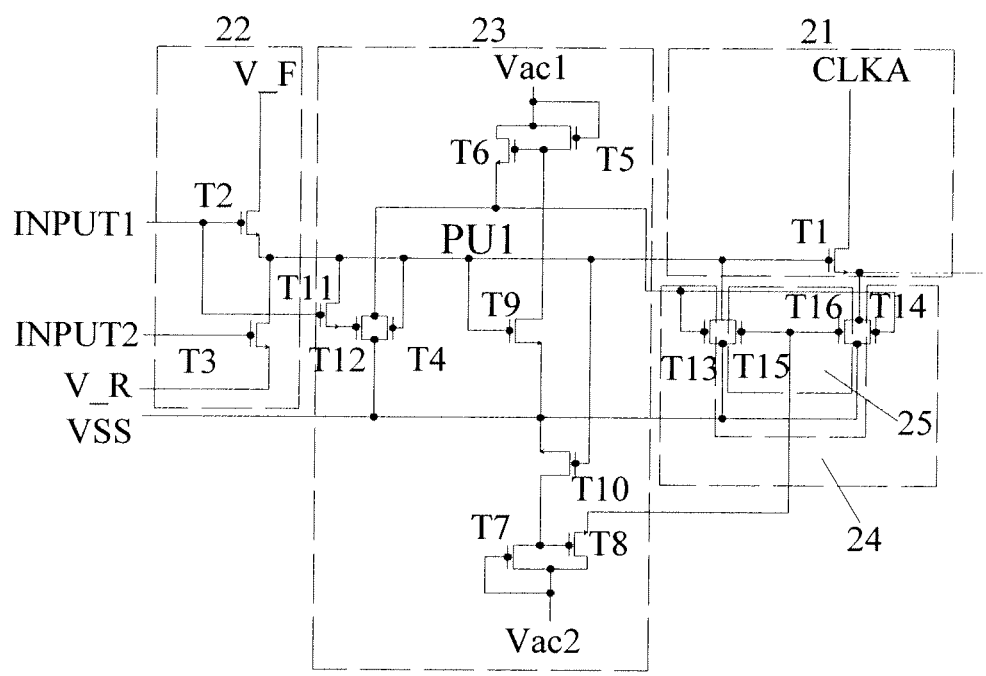
FIG. 3 is a schematic diagram for illustrating a circuit configuration of a shift register unit provided in the embodiments of the present disclosure.

Hereinafter, the technical solutions in the embodiments of the present disclosure will be described clearly and thoroughly with reference to the accompanying drawings of the embodiments of the present disclosure. Obviously, the embodiments as described are only some of the embodiments of the present disclosure, and are not all of the embodiments of the present disclosure. All other embodiments obtained by those skilled in the art based on the embodiments in the present disclosure without paying any inventive labor should fall into the protection scope of the present disclosure.

The transistors employed in all of the embodiments of the present disclosure can be Thin Film Transistors (TFTs), Field Effect Transistors (FETs), or other devices with the same characteristics. Since a source and a drain of a transistor employed herein are symmetric, there is no difference between the source and the drain. In the embodiments of the present disclosure, to distinguish two electrodes of a transistor other than a gate thereof, one of the two electrodes is referred to as a source, and the other of the two electrodes is referred to as a drain. Besides, a transistor can be classified to an N type transistor or a P type transistor according to the characteristics of the transistor, and the N type transistor is taken as an example in the description of the embodiments as below. It is easy for those skilled in the art to think of an implementation in which a P type transistor is utilized without paying any inventive labor, and such an implementation should fall into the protection scope of the present disclosure.

A shift register unit provided in an embodiment of the present disclosure is as shown in FIG. 2, and comprises a first pull-up module 21, a first scanning module 22, a control module 23, a first pull-down module 24 and a second pull-down module 25.

The first pull-up module 21 receives a first clock signal CLKA, is connected to a first control node PU1 and a first signal output terminal OUTPUT1, and is used for pulling up a signal output from the first signal output terminal OUTPUT1 to a high level under the control of the first scanning module 22 and the first clock signal CLKA.

The first scanning module 22 receives a first scanning signal V_F and a second scanning signal V_R, is connected to a first signal input terminal INPUT1, a second signal input terminal INPUT2 and the first control node PU1, and is used for determining a scanning direction under the control of the first scanning signal V_F and the second scanning signal V_R, and is used for controlling a potential at the first control node PU1 according to signals input from the first signal input terminal INPUT1 and the second signal input terminal INPUT2.

The control module 23 receives a first AC signal Vac1 and a second AC signal Vac2, is connected to the first control node PU1, the first pull-down module 24, the second pull-down module 25 and a voltage terminal VSS, and is used for controlling the first pull-down module 24 and the second pull-down module 25 according to the first AC signal Vac1 and the second AC signal Vac2.

The first pull-down module 24 and the second pull-down module 25 are further connected to the first control node PU1, the first signal output terminal OUTPUT1 and the voltage terminal VSS, and are used for pulling down a signal output from the first signal output terminal OUTPUT1 alternately under the control of the control module 23.

The shift register unit provided in the embodiment of the present disclosure can achieve the purpose for controlling the first pull-down module and the second pull-down module to operate alternately by two AC signals during two adjacent frame periods. Thus, the influence of the gate bias of each of the pull-down modules in the shift register unit can be decreased effectively, and the stability of the shift register unit can be improved.

It should be noted that the voltage terminal VSS can be a grounding terminal, or the voltage terminal VSS can input a low level signal, and that the first control node PU1 can be used for controlling the first pull-up module 21 to be turned on or turned off.

Further, as shown in FIG. 3, in the shift register unit provided in the embodiment of the present disclosure, the first pull-up module 21 can comprise a first transistor T1 having a source connected to the first signal output terminal OUTPUT1, a gate connected to the first control node PU1, and a drain receiving the first clock signal CLKA.

In the embodiment of the present disclosure, under the control of the first control node PU1, the first pull-up module 21 functions to make the first signal output terminal OUTPUT1 output a high level signal for gate driving when the first clock signal CLKA is at a high level.

Further, the first scanning module 22 can comprise a second transistor T2 and a third transistor T3.

The second transistor T2 has a source connected the first control node PU1, a gate connected to the first signal input terminal INPUT1, and a drain receiving the first scanning signal V_F.

The third transistor T3 has a source connected the first control node PU1, a gate connected to the second signal input terminal INPUT2, and a drain receiving the second scanning signal V_R.

The first scanning module 22 can control a scanning direction according to the levels of the first scanning signal V_F and the second scanning signal V_R. For example, when the first scanning signal V_F is at a high level and the second scanning signal V_R is at a low level, the gate driving circuit can perform a forward scanning from top to bottom; when the first scanning signal V_F is at a low level and the second scanning signal V_R is at a high level, the gate driving circuit can perform a reverse scanning from bottom to top.

Further, the control module 23 can comprise fourth to tenth transistors T4-T10.

The fourth transistor T4 has a source connected to the voltage terminal VSS, a drain connected to a source of the sixth transistor T6, a gate connected to the first control node PU1.

The fifth transistor T5 has a source connected to a gate of the sixth transistor T6, a gate and drain both receiving the first AC signal Vac1.

The sixth transistor T6 has a drain for receiving the first AC signal Vac1.

The seventh transistor T7 has a source connected to a gate of the eighth transistor T8, a gate and drain both receiving the second AC signal Vac2.

The eighth transistor T8 has a drain receiving the second AC signal Vac2.

The ninth transistor T9 has a source connected to the voltage terminal VSS, a gate connected to the first control node PU1, and a drain connected to the gate of the sixth transistor T6.

The tenth transistor T10 has a source connected to the voltage terminal VSS, a gate connected to the first control node PU1, and a drain connected to the gate of the eighth transistor T8.

Preferably, the control module 23 can further comprise an eleventh transistor T11 and a twelfth transistor T12.

The eleventh transistor T11 has a source connected to a gate of the twelfth transistor T12, a gate connected to the first signal input terminal INPUT1, and a drain connected to the first control node PU1.

The twelfth transistor T12 has a source connected to the voltage terminal VSS, and a drain connected to the source of the sixth transistor T6.

The twelfth transistor T12 and the fourth transistor T4 form a symmetrical structure, and the stability of the circuit configuration of the shift register unit can be further improved by the eleventh transistor T11 and the twelfth transistor T12.

Further, the first pull-down module 24 can comprise a thirteenth transistor T13 and a fourteenth transistor T14, wherein gates of the thirteenth transistor T13 and the fourteenth transistor T14 are connected to the source of the sixth transistor T6, drains of the thirteenth transistor T13 and the fourteenth transistor T14 are connected to the voltage terminal VSS, a source of the thirteenth transistor T13 is connected to the first control node PU1, and a source of the fourteenth transistor T14 is connected to the first signal output terminal OUTPUT1.

The second pull-down module 25 can comprise a fifteenth transistor T15 and a sixteenth transistor T16, wherein gates of the fifteenth transistor T15 and the sixteenth transistor T16 are connected to the source of the eighth transistor T8, drains of the fifteenth transistor T15 and the sixteenth transistor T16 are connected to the voltage terminal VSS, a source of the fifteenth transistor T15 is connected to the first control node PU1, and a source of the sixteenth transistor T16 is connected to the first signal output terminal OUTPUT1.

The thirteenth transistor T13 and the fifteenth transistor T15 form a symmetrical structure, and the fourteenth transistor T14 and the sixteenth transistor T16 also form a symmetrical structure, wherein two sets of symmetrical structure are utilized for discharging the first signal output terminal OUTPUT1 and the first control node PU1 when the first AC signal Vac1 or the second AC signal Vac2 is at a high level and the first control node PU1 is at a low level.

The shift register unit with the above configuration can achieve the purpose for controlling the first pull-down module and the second pull-down module to operate alternately by two AC signals during two adjacent frame periods. Thus, the influence of the gate bias of each of the pull-down modules in the shift register unit can be decreased effectively, and the stability of the shift register unit can be improved.

Figure 4:
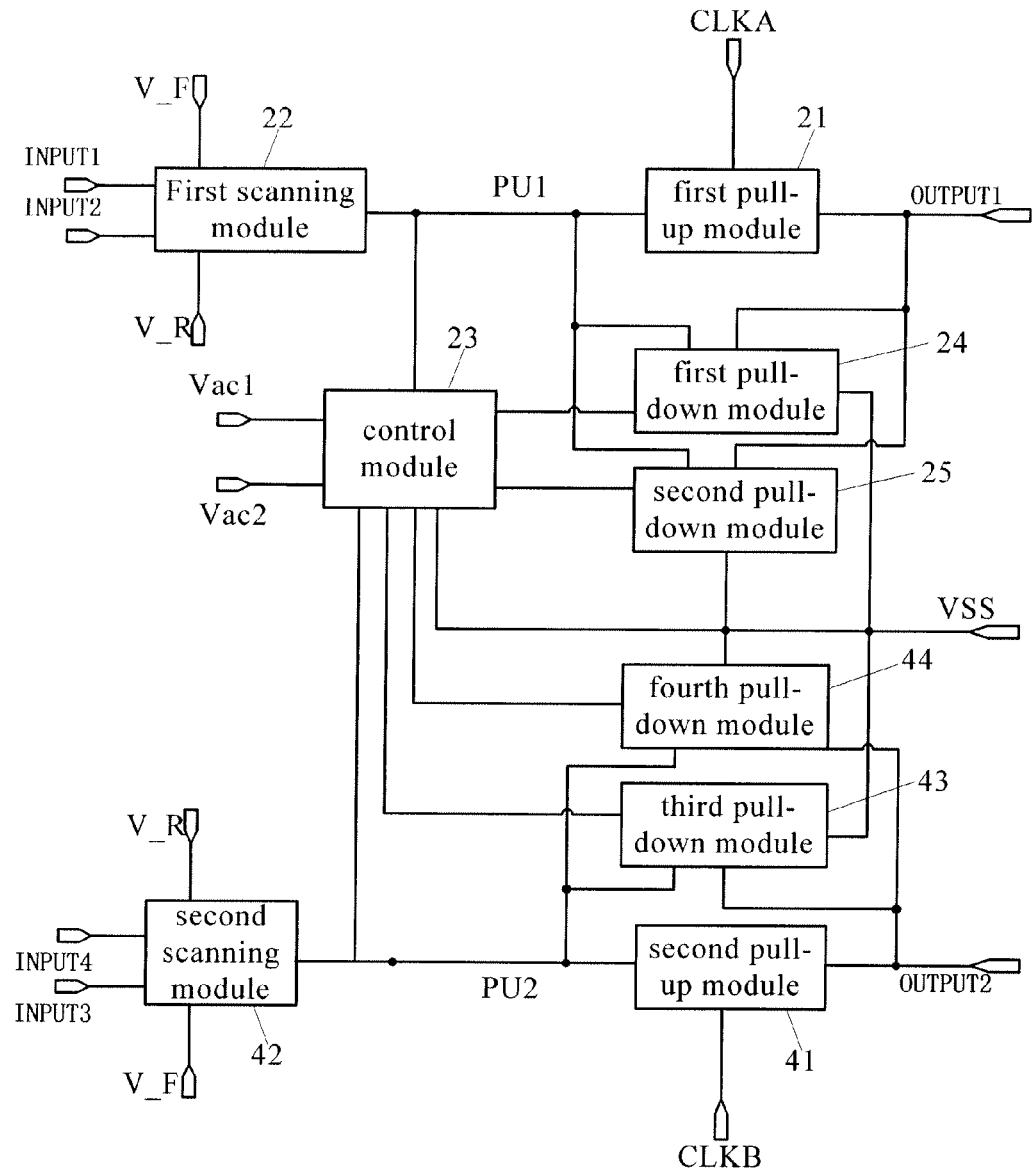
FIG. 4 is a schematic diagram for illustrating a structure of another shift register unit provided in the embodiments of the present disclosure.

On the basis of the above shift register unit, in the embodiments of the present disclosure, there is further provided another shift register unit as shown in FIG. 4, wherein besides individual function modules illustrated in FIG. 2, the shift register unit further comprises a second pull-up module 41, a second scanning module 42, a third pull-down module 43 and a fourth pull-down module 44.

The second pull-up module 41 receives a second clock signal CLKB, is connected to a second control node PU2 and a second signal output terminal OUTPUT2, and is used for pulling up a signal output from the second signal output terminal OUTPUT2 to a high level under the control of the second scanning module 42 and the second clock signal CLKB.

The second scanning module 42 receives the first scanning signal V_F and the second scanning signal V_R, is connected to a third signal input terminal INPUT3, a fourth signal input terminal INPUT4 and the second control node PU2, and is used for determining a scanning direction under the control of the first scanning signal V_F and the second scanning signal V_R, and is used for controlling the potential at the second control node PU2 according to signals input from the third and fourth signal input terminals INPUT3 and INPUT4.

The control module 23 is further connected to the second control node PU2, the third pull-down module 43, and the fourth pull-down module 44, and is further used for controlling the third pull-down module 43 and the fourth pull-down module 44 according to the first AC signal Vac1 and the second AC signal Vac2.

The third and fourth pull-down modules 43 and 44 are further connected to the second control node PU2, the second signal output terminal OUTPUT2 and the voltage terminal VSS, and are used for pulling down a signal output from the second signal output terminal OUTPUT2 alternately under the control of the control module 23.

Compared to the shift register unit shown in FIG. 2, such a shift register unit shown in FIG. 4 has four signal input terminals and two signal output terminals so as to respectively control the first pull-down module and the second pull-down module to pull down the first signal output terminal alternately and to respectively control the third pull-down module and the fourth pull-down module to pull down the second signal output terminal alternately during two adjacent frame periods. Thus, it can be achieved that one shift register unit outputs gate driving signals for two adjacent rows while the influence of the gate bias of each of the pull-down modules in the shift register unit is decreased and the stability of the shift register unit is improved, thus enhancing the utilization of the shift register unit and reducing the number of the shift register units in use significantly.

It should be noted that the second control node PU2 can be used for controlling the second pull-up module to be turned on or turned off.

Figure 5:
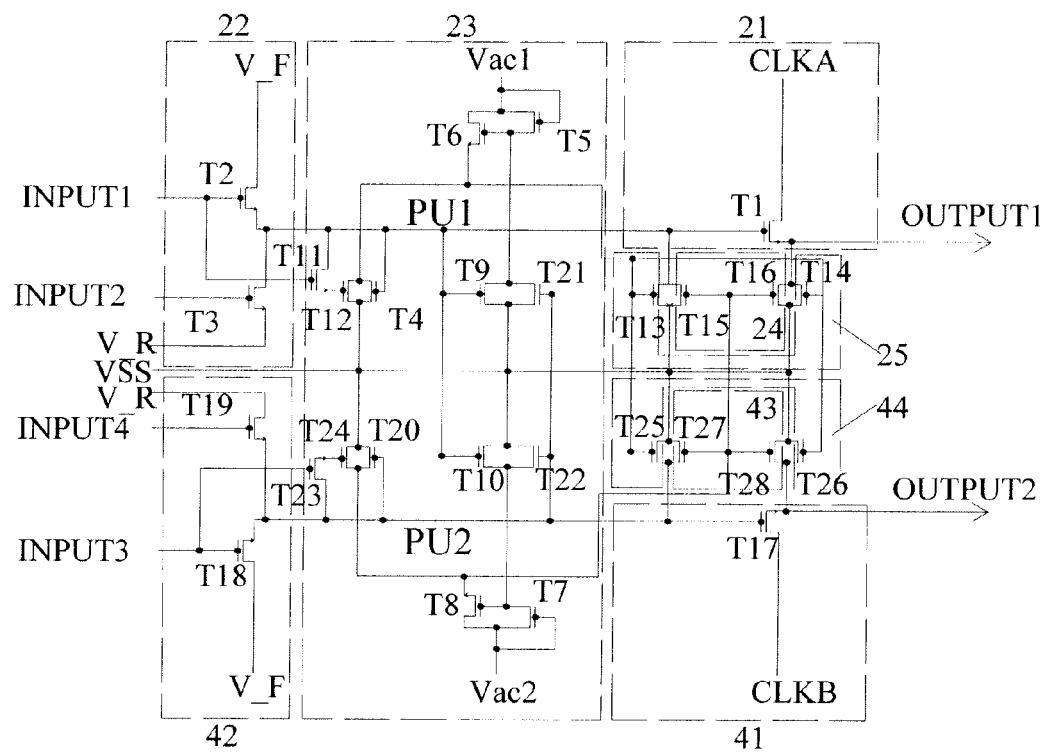
FIG. 5 is a schematic diagram for illustrating a circuit configuration of another shift register unit provided in the embodiments of the present disclosure.

Further, as shown in FIG. 5, in the shift register unit provided in the embodiment of the present disclosure can be based on the shift register unit shown in FIG. 3, wherein the second pull-up module 41 can comprise a seventeenth transistor T17 having a source connected the second signal output terminal OUTPUT2, a gate connected to the second control node PU2, and a drain receiving the second clock signal CLKB.

In an embodiment of the present disclosure, under the control of the second control node PU2, the second pull-up module 41 functions to make the second signal output terminal OUTPUT2 output a high level signal for gate driving when the second clock signal CLKB is at a high level.

Further, the second scanning module 42 can comprise an eighteenth transistor T18 and a nineteenth transistor T19.

The eighteenth transistor T18 has a source connected the second control node PU2, a gate connected to the third signal input terminal INPUT3, and a drain receiving the first scanning signal V_F.

The nineteenth transistor T19 has a source connected the second control node PU2, a gate connected to the fourth signal input terminal INPUT4, and a drain receiving the second scanning signal V_R.

Further, on the basis of the control module 23 shown in FIG. 3, the control module 23 can further comprise twentieth to twenty-second transistors T20-T22.

The twentieth transistor T20 has a source connected to the voltage terminal VSS, a drain connected to the source of the eighth transistor T8, and a gate connected to the second control node PU2.

The twenty-first transistor T21 has a source connected to the voltage terminal VSS, a gate connected to the second control node PU2, and a drain connected to the gate of the sixth transistor T6.

The twenty-second transistor T22 has a source connected to the voltage terminal VSS, a gate connected to the second control node PU2, and a drain connected to the gate of the eighth transistor T8.

Preferably, the control module 23 can further comprise a twenty-third transistor T23 and a twenty-fourth transistor T24.

The twenty-third transistor T23 has a source connected to a gate of the twenty-fourth transistor T24, a gate connected to the third signal input terminal INPUT3, and a drain connected to the second control node PU2.

The twenty-fourth transistor T24 has a source connected to the voltage terminal VSS, and a drain connected to the source of the eighth transistor T8.

The twenty-fourth transistor T24 and the twentieth transistor 20 form a symmetrical structure, and the stability of the circuit configuration can be further improved by the twenty-third transistor T23 and the twenty-fourth transistor T24.

It should be noted that the remaining configuration of the control module 23 can be referred to the control module 23 shown in FIG. 3, and the details is omitted.

Further, the third pull-down module 43 can comprise a twenty-fifth transistor T25 and a twenty-sixth transistor T26, wherein gates of the twenty-fifth transistor T25 and the twenty-sixth transistor T26 are connected to the source of the sixth transistor T6, drains of the twenty-fifth transistor T25 and the twenty-sixth transistor T26 are connected to the voltage terminal VSS, a source of the twenty-fifth transistor T25 is connected to the second control node PU2, and a source of the twenty-sixth transistor T26 is connected to the second signal output terminal OUTPUT2.

The fourth pull-down module 44 can comprise a twenty-seventh transistor T27 and a twenty-eighth transistor T28, wherein gates of the twenty-seventh transistor T27 and the twenty-eighth transistor T28 are connected to the source of the eighth transistor T8, drains of the twenty-seventh transistor T27 and the twenty-eighth transistor T28 are connected to the voltage terminal VSS, a source of the twenty-seventh transistor T27 is connected to the second control node PU2, and a source of the twenty-eighth transistor T28 is connected to the second signal output terminal OUTPUT2.

The twenty-fifth transistor T25 and the twenty-seventh transistor T27 form a symmetrical structure, and the twenty-sixth transistor T26 and the twenty-eighth transistor T28 also form a symmetrical structure, wherein two sets of symmetrical structure are utilized for discharging the second signal output terminal OUTPUT2 and the second control node PU2 when the first AC signal Vac1 or the second AC signal Vac2 is at a high level and the second control node PU2 is at a low level.

The shift register unit with the above structure has four signal input terminals and two signal output terminals so as to respectively control the first pull-down module and the second pull-down module to pull down the first signal output terminal alternately and to respectively control the third pull-down module and the fourth pull-down module to pull down the second signal output terminal alternately during two adjacent frame periods. Thus, it can be achieved that one shift register unit outputs gate driving signals for two adjacent rows while the influence of the gate bias of each of the pull-down modules in the shift register unit is decreased and the stability of the shift register unit is improved, thus enhancing the utilization of the shift register unit and reducing the number of the shift register units in use significantly.

Figure 6:
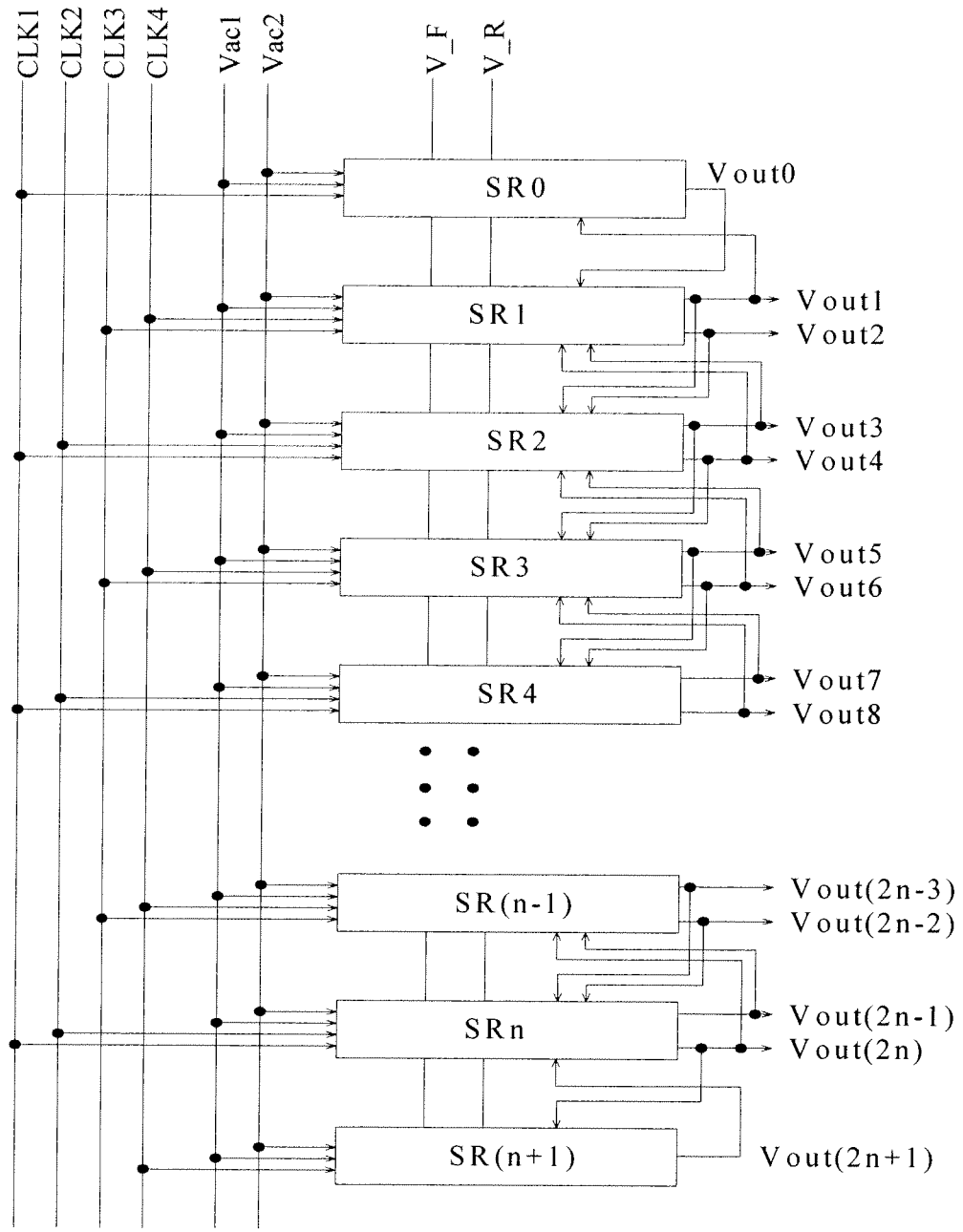
FIG. 6 is a schematic diagram for illustrating a structure of a gate driving circuit provided in the embodiments of the present disclosure.

The gate driving circuit provided in the embodiment of the present disclosure is as shown in FIG. 6, and comprises a plurality of stages of the shift register units as described above, wherein an output terminal of each stage of the shift register unit SR outputs a row scanning signal Vout for turning on TFTs on a corresponding gate line.

Preferably, except a zeroth stage of shift register unit SR0 and a last stage of shift register unit SRn+1, output terminals of other stages of shift register units output row scanning signals Vout for turning on TFTs on corresponding gate lines respectively.

Except the zeroth stage of shift register unit SR0, the signal output terminal OUTPUT of each stage of shift register unit is connected to a reset terminal of an adjacent previous stage of shift register unit, wherein in the shift register unit as a present stage shown in FIG. 3, the terminal INPUT2 serves as the reset terminal of the present stage of shift register unit; in the shift register unit as a present stage shown in FIG. 5, both the terminal INPUT2 and the terminal INPUT4 serve as the reset terminals of the present stage of shift register unit.

Except the last stage of shift register unit SRn+1, the signal output terminal OUTPUT of each stage of shift register unit is connected to an input terminal of an adjacent next stage of shift register unit, wherein in the shift register unit as a present stage shown in FIG. 3, the terminal INPUT1 serves as the signal input terminal of the present stage of shift register unit; in the shift register unit as a present stage shown in FIG. 5, both the terminal INPUT1 and the terminal INPUT3 serve as the input terminals of the present stage of shift register unit.

The gate driving circuit provided in the embodiments of the present disclosure comprises a plurality of stages of shift register units, wherein the shift register unit can achieve the purpose for controlling the first pull-down module and the second pull-down module to operate alternately by two AC signals during two adjacent frame periods. Thus, the influence of the gate bias of each of the pull-down modules in the shift register unit can be decreased effectively, and the stability of the shift register unit can be improved.

Further, in the gate driving circuit shown in FIG. 6, both the zeroth stage of shift register unit SR0 and the last stage of shift register unit SRn+1 can employ the shift register unit shown in FIG. 3, and other stages of shift register units can employ the shift register unit shown in FIG. 5.

Except the zeroth stage of shift register unit SR0 and the last stage of shift register unit SRn+1, the first signal output terminal OUTPUT1 of each stage of shift register unit is connected to the second signal input terminal INPUT2 of an adjacent previous stage of shift register unit, and the second signal output terminal OUTPUT2 of each stage of shift register unit is connected to the fourth signal input terminal INPUT4 of the adjacent previous stage of shift register unit.

Except the zeroth stage of shift register unit SR0 and the last stage of shift register unit SRn+11, the first signal output terminal OUTPUT1 of each stage of shift register unit is connected to the first signal input terminal INPUT1 of an adjacent next stage of shift register unit, and the second signal output terminal OUTPUT2 of each stage of shift register unit is connected to the third signal input terminal INPUT3 of the adjacent next stage of shift register unit.

The first signal input terminal INPUT1 of the zeroth stage of shift register unit SR0 inputs a frame start signal STV; the second signal input terminal INPUT2 of the last stage of shift register unit SRn+1 also inputs the frame start signal STV.

It should be noted that four clock signals, i.e., CLK1-CLK4, are utilized in the gate driving circuit provided in the embodiment of the present disclosure, wherein the clock signal CLK1 is input to the zeroth stage of shift register unit SR0, the clock signal CLK4 is input to the last stage of shift register unit SRn+1, and the clock signals input to each other stage of shift register unit are different from those input to an adjacent previous stage of shift register and an adjacent next stage of shift register unit. For example, the clock signals CLK3 and CLK4 are input to the shift register unit at an even stage SR($2i$), and the clock signals CLK1 and CLK2 are input to the shift register unit at an odd stage SR($2i-1$), wherein i is an integer greater than 0. The frequency of the clock signals can be decreased by increasing the number of clock signal lines, thus achieving the purpose of reducing the power consumption.

Hereinafter, the first scanning module 22, the first pull-up module 21, the first pull-down module 24 and the second pull-down module 25 as a whole are referred to as a first part of the shift register unit, and the second scanning module 42, the second pull-up module 41, the third pull-down module 43 and the fourth pull-down module 44 as a whole are referred to as a second part of the shift register unit.

Figure 7:
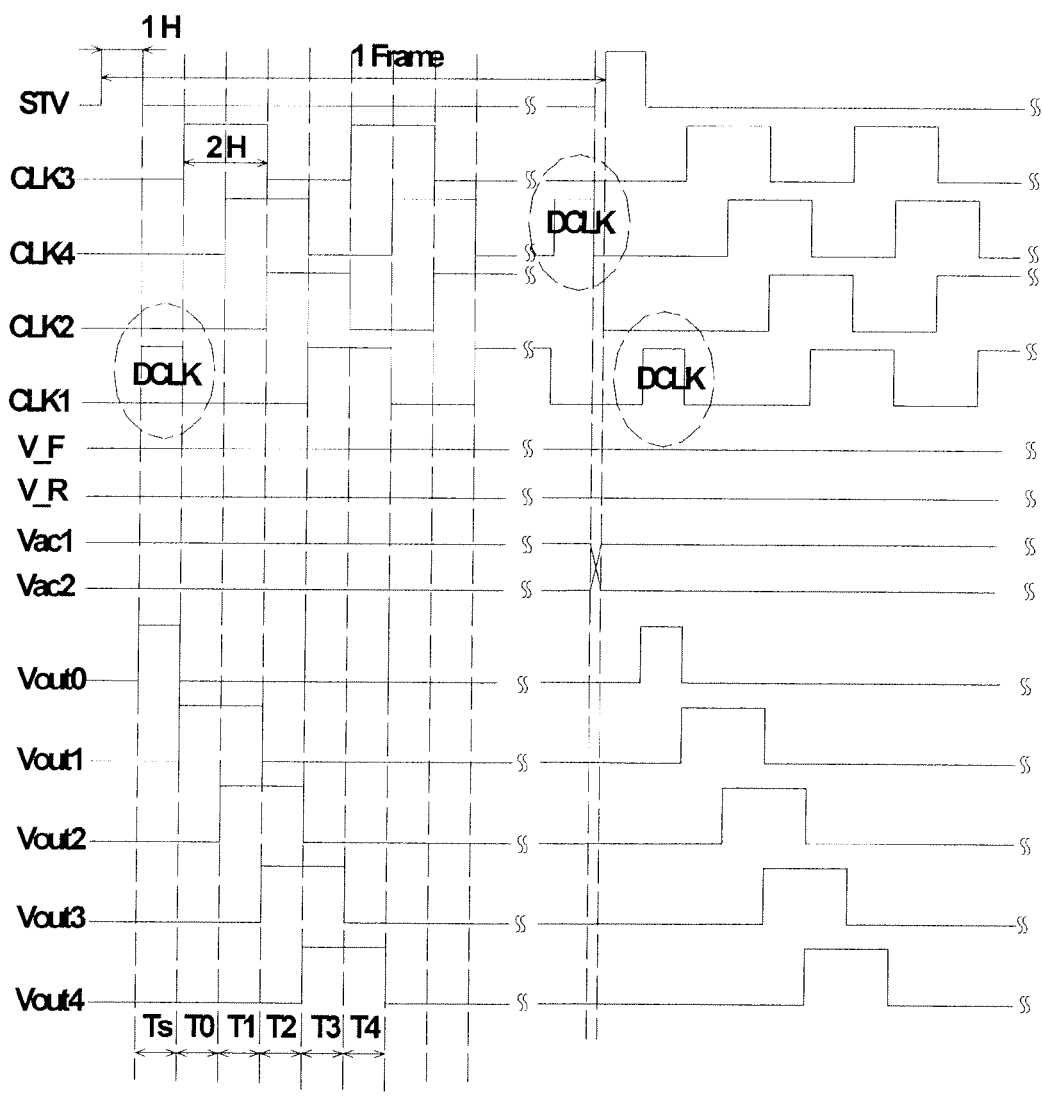
FIG. 7 is a timing waveform diagram for illustrating individual signals when the shift register unit provided in the embodiments of the present disclosure performs a forward scanning.

FIG. 7 is a timing waveform diagram for illustrating individual signals when the shift register unit provided in the embodiment of the present disclosure performs a forward scanning. In FIG. 7, the scanning time period is the scanning time interval of two frames, where timing waveforms of the frame start signal STV, the clock signals CLK1-CLK4, the first AC signal Vac1, the second AC signal Vac2, the voltage VSS, the first scanning signal V_F, the second scanning signal V_R, and signals from first five output terminals Vout0-Vout4 are illustrated, wherein it is presumed a case in which one pulse width of STV is 1H, and one pulse width of CLK1-CLK4 is 2H, peaks of adjacent clock signals overlap a time interval of 1H. The pulse DCLK indicated with a circular dotted line represents a dummy CLK superposing on CLK1 and CLK4, and the dummy CLK is arranged for the purpose of inputting CLK to the zeroth stage of shift register unit SR0 and to the last stage of shift register unit SRn+1.

It should be noted that, in the embodiment of the present disclosure, a case in which one pulse width of STV is 1H and one pulse width of CLK1-CLK4 is 2H is taken as an example for illustration. It can be readily conceived that both one pulse width of STV and that of CLK1-CLK4 can be 1H, and there is no limitation on the pulse width in the embodiment of present disclosure. By use of square wave pulses with the width as shown in FIG. 7, it can be achieved that a next stage of shift register unit is precharged during a second half of the time period in which the output signal of the present stage of shift register unit is at a high level, thus improving the output stability of the shift register unit.

The operating process of the gate driving circuit provided in the embodiment of the present disclosure is described in detail as follows with reference to FIG. 7. As shown in FIG. 7, when a forward scanning is performed, the scanning signals V_F and V_R are set to be at a high level and a low level respectively, the AC signal Vac1 is at a high level during a present frame and is at a low level during a next frame, and the AC signal Vac2 has a level opposite to the AC signal Vac1. During a time period immediately prior to Ts, STV is at a high level, TFT T2 in the shift register unit SR0 is turned on, wherein the structure of SR0 is as shown in FIG. 3, the node PU1 is charged, the transistors T1, T4, T9, T10, T11 and T12 are turned on, and thus the sources of the transistors T6 and T8 both are set at a low level, so that all of the transistors T13, T14, T15 and T16 are turned off.

During a time period Ts, the clock signal CLK1 is input to the terminal CLKA of SR0, the DCLK superposing on CLK1 is at a high level, and the transistor T1 in SR0 pulls up the output signal Vout0 of SR0 to a high level. Meanwhile, the output signal Vout0 is input to the first signal input terminal INPUT1 in the first part and the third signal input terminal INPUT3 in the second part of the first stage of shift register unit SR1, i.e., the output signal Vout0 is input to the gates of TFTs T2 and T18, so that TFTs T2 and T18 are turned on, wherein the structure of SR1 is as shown in FIG. 5, the nodes PU1 and PU2 in SR1 are charged; at the same time, the transistors T1, T4, T9, T10, T11, T12, T17, T20, T21, T22, T23 and T24 are turned on, and the sources of transistors T6 and T8 are set to be at a low level, so that all of the transistors T13, T14, T15, T16, T25, T26, T27 and T28 are turned off.

During a time period T0, the clock signal CLK3 input to the terminal CLKA in the first stage of shift register unit SR1 is at a high level, and at this time the transistor T1 in SR1 pulls up the output signal Vout1 of SR1 to a high level signal, and the output signal Vout1 is input to the second signal input terminal INPUT2 in the first part of SR0, i.e., to the gate of transistor T3, so as to turn on transistor T3, and thus the node PU1 in SR0 is discharged to a low level V_R; meanwhile, the output signal Vout1 is further input to the first signal input terminal INPUT1 in the first part of the second stage of shift register unit SR2, i.e., to the gate of transistor T2, so as to turn on the transistor T2 in SR2, and thus the node PU1 in SR2 is charged.

During a time period T1, the clock signal CLK4 input to the terminal CLKB in the first stage of shift register unit SR1 is at a high level, and it can be known from the above, the transistor T17 in the second part of the SR1 is turned on; thus, the transistor T17 in SR1 outputs the high level signal to Vout2, and then the high level signal is input to the third signal input terminal INPUT3 in the second part of the second stage of shift register unit SR2, i.e, to the gate of the transistor T18 in the second part of SR2 to turn on the transistor T18 in the second part of SR2, so that the node PU2 in the second part of SR2 is charged and the transistor T17 in the second part of SR2 is turned on.

During a time period T2, the clock signal CLK2 input to the terminal CLKA in the second stage of shift register unit SR2 is at a high level, and it can be known from the above, the transistor T1 in the first part of SR2 is turned on; thus, a high level signal is output through the transistor T1 to Vout3, and on one hand, the high level signal of Vout3 is input to the second signal input terminal INPUT2 in the first part of SR1, i.e., the gate of the transistor T3 in SR1, so that the node PU1 in SR1 is discharged to the low level V_R, and on the other hand, the high level signal of Vout3 is input to the first signal input terminal INPUT1 in the first part of the third stage of shift register SR3, i.e., the gate of the transistor T2 in SR3, so that the node PU1 in SR3 is charged and the transistor T1 in SR3 is turned on; meanwhile, Vout2 continues to output the high level signal.

During subsequent time periods, since the AC signal Vac1 is at a high level, the AC signal Vac1 at the high level is output from the source of the transistor T6 in SR0 and the source of transistor T6 in SR1 via transistors T5 and T6 in SR0 and SR1, and the transistors T13 and T14 in SR0 are turned on, and the transistors T13, T14, T25 and T26 in SR1 are turned on, so that the output terminals Vout0, Vout1, and Vout2 as well as the node PU1 in SR0, the nodes PU1 and PU2 in SR1 are discharged to the low level VSS.

During a time period T3, the clock signal CLK1 input to the terminal CLKB in the second stage of shift register unit SR2 changes to be at a high level, and it can be known from the above, the transistor T17 in the second part of the SR2 is turned on; thus, a high level signal is output through the transistor T17 to Vout4; at the same time, Vout3 continues to output the high level signal at CLK2. At this time, the high level signal at Vout4, on one hand, is input to the fourth signal input terminal INPUT4 in the second part of SR1, i.e., the gate of the transistor T19, so that the node PU2 in SR1 is discharged to the low level V_R, and on the other hand, is input to the third signal input terminal INPUT3 in the second part of the third stage of shift register SR3, i.e., the gate of the transistor T18, so that the node PU2 in SR3 is charged and the transistor T17 is turned on; meanwhile, Vout3 continues to output the high level signal at CLK2.

During a time period T4, Vout4 continues to output the high level signal at CLK1.

During subsequent time periods, the nodes PU1 and PU2 in the first part and the second part of the second stage of shift register unit SR2 are both discharged to a low level; at this time, since the AC signal Vac1 is at a high level, the AC signal Vac1 at the high level is output from the source of the transistor T6 in SR2 via the transistors T5 and T6, and the transistors T13, T14, T25 and T26 in SR2 are turned on, so that the output terminals Vout3, Vout4 as well as the nodes PU1 and PU2 in SR2 are discharged to the low level VSS.

In addition, the process occurring during the subsequent time periods is similar to the process of T0-T4.

During a time period approaching to an end of a frame, as shown in FIG. 7, the dummy pulse DCLK superposing on CLK4 is input to the drain of transistor T1 in the last stage of shift register unit SRn+1, and is output via T1 to Vout(2n+1), wherein the circuit configuration of the last stage of shift register unit SRn+1 can be referred to FIG. 3, the dummy pulse DCLK at a high level is input to the second signal input terminal INPUT2 in the first part and the fourth signal input terminal INPUT4 in the second part of SRn, i.e., to the gate of the transistor T3 and the gate of the transistor T19, so that the nodes PU1 and PU2 in SRn are discharged to the low level V_R.

During a next frame period, the AC signal Vac1 changes to be a low level, Vac2 changes to be a high level, and other signals are the same as those in the present frame. Relative to the present frame, the AC signals Vac1 and Vac2 both change to have an opposite level, so that during the subsequent discharging time period, since Vac2 is at a high level, for the shift register units other than the last stage of shift register unit, the high level signal of is output from the source of transistor T8 via transistors T7 and T8, and thus transistors T15, T16, T27 and T28 are turned on, so that the node PU1 in SR0 and the nodes PU1, PU2 in shift register units other than the last stage of shift register unit as well as the output terminals Vout0, . . . , Vout(2n−1) and Vout(2n) are discharged to the low level VSS. At the same time, since each stage of shift register unit charges the nodes PU1 and PU2 in the next stage of shift register unit, so that the source of the transistor T6 in the next stage of shift register unit is pulled down to the low level VSS, that is, the gates of transistor T13 and T14 in SR0 and the gates of transistors T13, T14, T25 and T26 in the shift register units other than the last stage of shift register unit are discharged to the low level VSS and thus are turned off.

Therefore, it can be achieved that two sets of pull-down modules in SR0 and two sets of pull-down modules in each part of shift register units other than the last stage of shift register unit operate alternately during two adjacent frame periods, and thus the influence of the gate bias of the gate of each of the pull-down TFTs is reduced and the stability of the shift register unit is improved.

Figure 8:
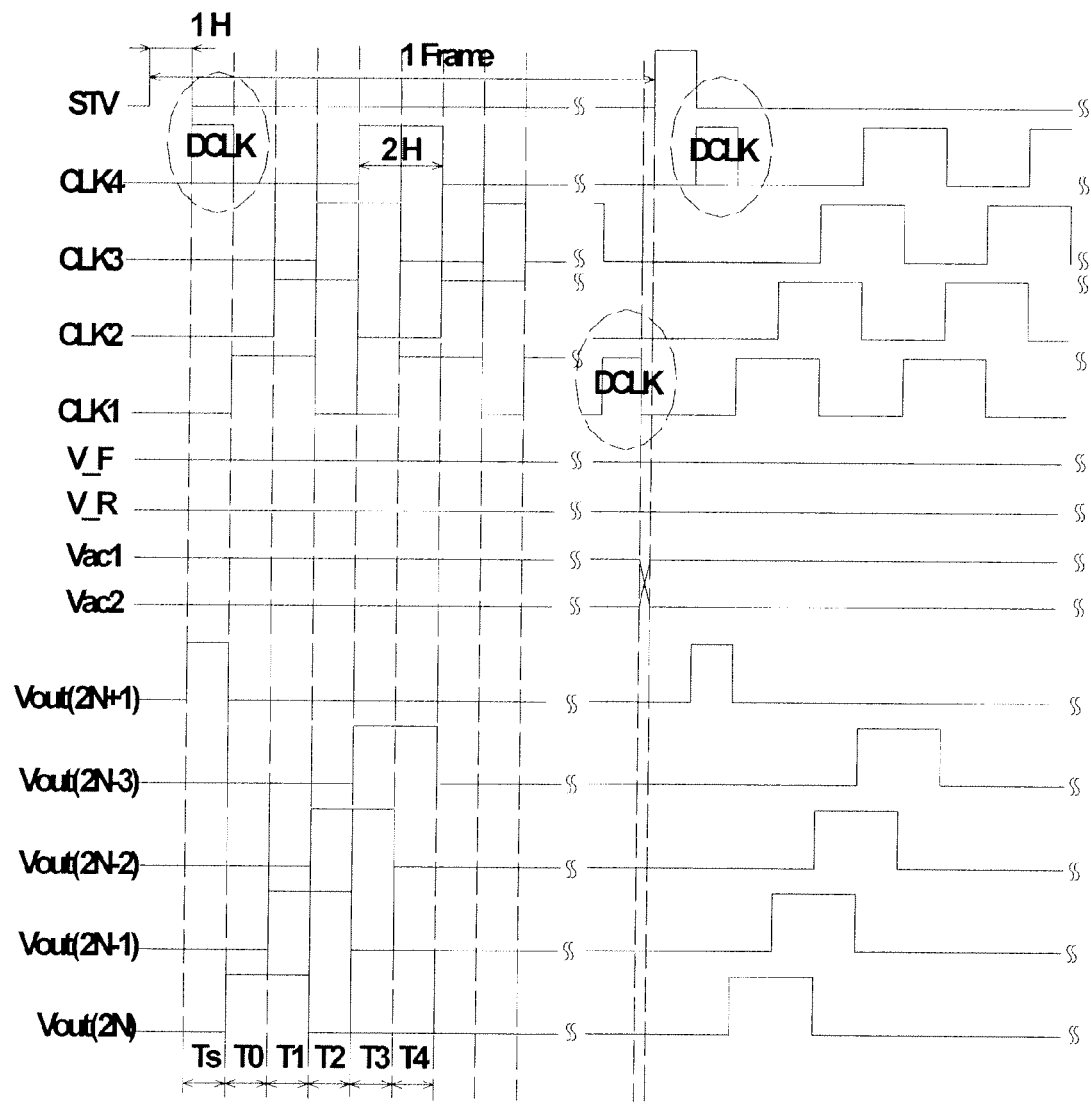
FIG. 8 is a timing waveform diagram for illustrating individual signals when the shift register unit provided in the embodiments of the present disclosure performs a reverse scanning.

FIG. 8 is a timing waveform diagram for illustrating individual signals when the shift register unit provided in the embodiment of the present disclosure performs a reverse scanning. Similar to FIG. 7, the scanning time period as provided is the scanning time period of two frames, and the scanning process as a whole is similar to that shown in FIG. 7. The difference is in that during the reverse scanning process, V_F is at a low level and V_R is at a high level, and output terminals which output a high level signal follow the sequence of Vout(2n+1), Vout(2n), Vout(2n−1), Vout(2n−2), . . . , and so on. Further, a high level signal output from each stage of shift register unit other than the zeroth stage of shift register unit is input to the adjacent previous stage of shift register unit; in particular, a high level signal output from the first signal output terminal OUTPUT1 in the first part of each stage of shift register unit other than the zeroth stage of shift register unit is input to the second signal input terminal INPUT2 in the first part of the adjacent previous stage of shift register unit, i.e., to the gate of the transistor T3; as an alternative, a high level signal output from the second signal output terminal OUTPUT2 in the second part of each stage of shift register unit other than the zeroth stage of shift register unit is input to the fourth signal input terminal INPUT4 in the second part of the adjacent previous stage of shift register unit, i.e., to the gate of the transistor T19, and via the transistor T3 or T19, V_R at the high level is input to the node PU1 in the last stage of shift register unit SRn+1 and the nodes PU1 and PU2 in the shift register units other than the zeroth stage of shift register unit. During the subsequent discharging periods, the set of transistors T13, T14 and the set of transistors T15, T16 in the last stage of shift register unit SRn+1 operate alternately, and the set of transistors T13, T14 and the set of transistors T15, T16 in shift register units other than the zeroth stage of shift register unit operate alternately, as well as the set of transistors T25, T26 and the set of transistors T27, T28 in shift register units other than the zeroth stage of shift register unit operate alternately.

It can be known from the analysis on the timing sequence shown in FIGS. 7 and 8 that the gate driving circuit provided in the embodiment of the present disclosure can achieve a bidirectional scanning function, wherein compared to the conventional shift register configuration, more clock signals and two AC signals are added, and the circuit configurations of the stages of the shift register units SR1-SRn as well as the zeroth stage of shift register unit SR0 and the last stage of shift register unit SRn+1 are redesigned, so that when a forward scanning or a reverse scanning is performed, discharging is performed by the two sets of pull-down modules in the shift register unit alternately in two adjacent frame periods according to the levels of the AC signals Vac1 and Vac2, thus reducing the influence of the gate bias of each of the pull-down module in the shift register unit and improving the stability of the shift register unit.

In embodiments of the present disclosure, there is further provided a display device comprising the gate driving circuit as described above.

The display device provided in the embodiment of the present disclosure comprises the gate driving circuit comprising a plurality of stages of shift register units therein, the shift register unit can achieve the purpose for controlling the first pull-down module and the second pull-down module to operate alternately by two AC signals during two adjacent frame periods. Thus, the influence of the gate bias of each of the pull-down modules in the shift register unit can be decreased effectively, and the stability of the shift register unit can be improved.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure.

What is claimed is:

1. A shift register unit comprising a first pull-up module, a first scanning module, a control module, a first pull-down module and a second pull-down module;
   wherein the first pull-up module receives a first clock signal, is connected to a first control node and a first signal output terminal, and is used for pulling up a signal output from the first signal output terminal to a high level under the control of the first scanning module and the first clock signal;
   the first scanning module receives a first scanning signal, a second scanning signal, is connected to a first signal input terminal, a second signal input terminal and the first control node, and is used for determining a scanning direction under the control of the first scanning signal and the second scanning signal, and for controlling a potential at the first control node according to signals input from the first signal input terminal and the second signal input terminal;
   the control module receives a first Alternating Current AC signal and a second AC signal, is connected to the first control node, the first pull-down module, the second pull-down module and a voltage terminal, and is used for controlling the first pull-down module and the second pull-down module according to the first AC signal and the second AC signal; and
   the first pull-down module and the second pull-down module are further connected directly to the first control node, the first signal output terminal and the voltage terminal, and are used for pulling down the signal output from the first signal output terminal alternately under the control of the control module;
   wherein a connection point between the control module and the first pull-down module is a first pull-down node, and a connection point between the control module and the second pull-down module is a second pull-down node,
   wherein the control module comprises an eleventh transistor having a source directly connected to a gate of a twelfth transistor, a gate directly connected to the first signal input terminal, and a drain directly connected to the first control node; and the twelfth transistor having a source directly connected to the voltage terminal, and a drain directly connected to the first pull-down node.

2. The shift register unit of claim 1, wherein the first pull-up module comprises:
   a first transistor having a source connected the first signal output terminal, a gate connected to the first control node, and a drain receiving the first clock signal.

3. The shift register unit of claim 1, wherein the first scanning module comprises:
   a second transistor having a source connected the first control node, a gate connected to the first signal input terminal, and a drain receiving the first scanning signal; and
   a third transistor having a source connected the first control node, a gate connected to the second signal input terminal, and a drain receiving the second scanning signal.

4. The shift register unit of claim 1, wherein the control module comprises:
   a fourth transistor having a source connected to the voltage terminal, a drain connected to a source of a sixth transistor, and a gate connected to the first control node;
   a fifth transistor having a source connected to a gate of the sixth transistor, a gate and drain both receiving the first AC signal;
   the sixth transistor having a drain for receiving the first AC signal;
   a seventh transistor having a source connected to a gate of an eighth transistor, a gate and drain both receiving the second AC signal;
   the eighth transistor having a drain receiving the second AC signal;
   a ninth transistor having a source connected to the voltage terminal, a gate connected to the first control node, and a drain connected to the gate of the sixth transistor; and
   a tenth transistor having a source connected to the voltage terminal, a gate connected to the first control node, and a drain connected to the gate of the eighth transistor.

5. The shift register unit of claim 4, wherein the first pull-down module comprises a thirteenth transistor and a fourteenth transistor, wherein gates of the thirteenth transistor and the fourteenth transistor are both connected to the source of the sixth transistor, drains of the thirteenth transistor and the fourteenth transistor are both connected to the voltage terminal, a source of the thirteenth transistor is connected to the first control node, and a source of the fourteenth transistor is connected to the first signal output terminal; and
   the second pull-down module comprises a fifteenth transistor and a sixteenth transistor, wherein gates of the fifteenth transistor and the sixteenth transistor are both connected to the source of the eighth transistor, drains of the fifteenth transistor and the sixteenth transistor are both connected to the voltage terminal, a source of the fifteenth transistor is connected to the first control node, and a source of the sixteenth transistor is connected to the first signal output terminal.

6. The shift register unit of claim 1, wherein the shift register unit further comprises a second pull-up module, a second scanning module, a third pull-down module and a fourth pull-down module;

wherein the second pull-up module receives a second clock signal, is connected to a second control node and a second signal output terminal, and is used for pulling up a signal output from the second signal output terminal to a high level under the control of the second scanning module and the second clock signal;

the second scanning module receives the first scanning signal and the second scanning signal, is connected to a third signal input terminal, a fourth signal input terminal and the second control node, and is used for determining a scanning direction under the control of the first scanning signal and the second scanning signal, and for controlling a potential at the second control node according to signals input from the third and fourth signal input terminals;

the control module is further connected to the second control node, the third pull-down module, and the fourth pull-down module, and is used for controlling the third pull-down module and the fourth pull-down module according to the first AC signal and the second AC signal; and the third and fourth pull-down modules are further connected to the second control node, the second signal output terminal and the voltage terminal, and are used for pulling down a signal output from the second signal output terminal alternately under the control of the control module.

7. The shift register unit of claim 6, wherein the second pull-up module comprises:
a seventeenth transistor having a source connected the second signal output terminal, a gate connected to the second control node, and a drain receiving the second clock signal.

8. The shift register unit of claim 6, wherein the second scanning module comprises:
an eighteenth transistor having a source connected the second control node, a gate connected to the third signal input terminal, and a drain receiving the first scanning signal; and
a nineteenth transistor having a source connected the second control node, a gate connected to the fourth signal input terminal, and a drain receiving the second scanning signal.

9. The shift register unit of claim 6, wherein the control module further comprises
a twentieth transistor having a source connected to the voltage terminal, a drain connected to the source of the eighth transistor, and a gate connected to the second control node;
a twenty-first transistor having a source connected to the voltage terminal, a gate connected to the second control node, and a drain connected to the gate of the sixth transistor; and
a twenty-second transistor having a source connected to the voltage terminal, a gate connected to the second control node, and a drain connected to the gate of the eighth transistor.

10. The shift register unit of claim 9, wherein the control module further comprises:
a twenty-third transistor having a source connected to a gate of a twenty-fourth transistor, a gate connected to the third signal input terminal, and a drain connected to the second control node; and
the twenty-fourth transistor having a source connected to the voltage terminal, a drain connected to the source of the eighth transistor.

11. The shift register unit of claim 9, wherein
the third pull-down module comprises: a twenty-fifth transistor and a twenty-sixth transistor, wherein gates of the twenty-fifth transistor and the twenty-sixth transistor are both connected to the source of the sixth transistor, drains of the twenty-fifth transistor and the twenty-sixth transistor are both connected to the voltage terminal, a source of the twenty-fifth transistor is connected to the second control node, and a source of the twenty-sixth transistor is connected to the second signal output terminal;
the fourth pull-down module comprises: a twenty-seventh transistor and a twenty-eighth transistor, wherein gates of the twenty-seventh transistor and the twenty-eighth transistor are both connected to the source of the eighth transistor, drains of the twenty-seventh transistor and the twenty-eighth transistor are both connected to the voltage terminal, a source of the twenty-seventh transistor is connected to the second control node, and a source of the twenty-eighth transistor is connected to the second signal output terminal.

12. A gate driving circuit comprising a plurality of stages of shift register units, wherein each stage of shift register unit comprises: a first pull-up module, a first scanning module, a control module, a first pull-down module and a second pull-down module;

wherein the first pull-up module receives a first clock signal, is connected to a first control node and a first signal output terminal, and is used for pulling up a signal output from the first signal output terminal to a high level under the control of the first scanning module and the first clock signal;

the first scanning module receives a first scanning signal and a second scanning signal, is connected to a first signal input terminal, a second signal input terminal and the first control node, and is used for determining a scanning direction under the control of the first scanning signal and the second scanning signal, and for controlling a potential at the first control node according to signals input from the first signal input terminal and the second signal input terminal;

the control module receives a first Alternating Current AC signal and a second AC signal, is connected to the first control node, the first pull-down module, the second pull-down module and a voltage terminal, and is used for controlling the first pull-down module and the second pull-down module according to the first AC signal and the second AC signal; and the first pull-down module and the second pull-down module are further directly connected to the first control node, the first signal output terminal and the voltage terminal, and are used for pulling down a signal output from the first signal output terminal alternately under the control of the control module;

wherein a connection point between the control module and the first pull-down module is a first pull-down node, and a connection point between the control module and the second pull-down module is a second pull-down node, the control module comprises an eleventh transistor having a source directly connected to a gate of a twelfth transistor, a gate directly connected to the first signal input terminal, and a drain directly connected to the first control node; and the twelfth transistor having a source directly connected to the voltage terminal, and a drain directly connected to the first pull-down node;

wherein except a zeroth stage of shift register unit, the first signal output terminal of each stage of shift register unit is connected to the second signal input terminal of an adjacent previous stage of shift register unit;

except a last stage of shift register unit, the first signal output terminal of each stage of shift register unit is connected to the first signal input terminal of an adjacent next stage of shift register unit.

13. The gate driving circuit of claim 12, wherein except the zeroth stage of shift register unit and the last stage of shift register unit, each stage of shift register unit further comprises: a second pull-up module, a second scanning module, a third pull-down module and a fourth pull-down module;

wherein the second pull-up module receives a second clock signal is connected to a second control node and a second signal output terminal, and is used for pulling up a signal output from the second signal output terminal to a high level under the control of the second scanning module and the second clock signal;

the second scanning module receives the first scanning signal and the second scanning signal, is connected to a third signal input terminal, a fourth signal input terminal and the second control node, and is used for determining a scanning direction under the control of the first scanning signal and the second scanning signal, and for controlling a potential at the second control node according to signals input from the third and fourth signal input terminals;

the control module is further connected to the second control node, the third pull-down module, and the fourth pull-down module, and is used for controlling the third pull-down module and the fourth pull-down module according to the first AC signal and the second AC signal; and the third and fourth pull-down modules are further connected to the second control node, the second signal output terminal and the voltage terminal, and are used for pulling down a signal output from the second signal output terminal alternately under the control of the control module, except the zeroth stage of shift register unit and the last stage of shift register unit, the first signal output terminal of each stage of shift register unit is connected to the second signal input terminal of an adjacent previous stage of shift register unit, and the second signal output terminal of each stage of shift register unit is connected to the fourth signal input terminal of the adjacent previous stage of shift register unit; and except the zeroth stage of shift register unit and the last stage of shift register unit, the first signal output terminal of each stage of shift register unit is connected to the first signal input terminal of an adjacent next stage of shift register unit, and the second signal output terminal of each stage of shift register unit is connected to the third signal input terminal of the adjacent next stage of shift register unit.

14. The gate driving circuit of claim 13, wherein the first signal input terminal of the zeroth stage of shift register unit inputs a frame start signal STV; and the second signal input terminal of the last stage of shift register unit inputs the frame start signal STV.

15. The gate driving circuit of claim 12, wherein the first signal input terminal of the zeroth stage of shift register unit inputs a frame start signal STV; and the second signal input terminal of the last stage of shift register unit inputs the frame start signal STV.

16. A display device comprising a gate driving circuit, wherein the gate driving circuit comprises a plurality of stages of shift register units, each stage of shift register unit comprises: a first pull-up module, a first scanning module, a control module, a first pull-down module and a second pull-down module;

wherein the first pull-up module receives a first clock signal, is connected to a first control node and a first signal output terminal, and is used for pulling up a signal output from the first signal output terminal to a high level under the control of the first scanning module and the first clock signal;

the first scanning module receives a first scanning signal and a second scanning signal, is connected to a first signal input terminal, a second signal input terminal and the first control node, and is used for determining a scanning direction under the control of the first scanning signal and the second scanning signal, and for controlling a potential at the first control node according to signals input from the first signal input terminal and the second signal input terminal;

the control module receives a first Alternating Current AC signal and a second AC signal, is connected to the first control node, the first pull-down module, the second pull-down module and a voltage terminal, and is used for controlling the first pull-down module and the second pull-down module according to the first AC signal and the second AC signal; and the first pull-down module and the second pull-down module are further directly connected to the first control node, the first signal output terminal and the voltage terminal, and are used for pulling down a signal output from the first signal output terminal alternately under the control of the control module;

wherein a connection point between the control module and the first pull-down module is a first pull-down node, and a connection point between the control module and the second pull-down module is a second pull-down node, the control module comprises an eleventh transistor having a source directly connected to a gate of a twelfth transistor, a gate directly connected to the first signal input terminal, and a drain directly connected to the first control node; and the twelfth transistor having a source directly connected to the voltage terminal, and a drain directly connected to the first pull-down node;

wherein except a zeroth stage of shift register unit, the first signal output terminal of each stage of shift register unit is connected to the second signal input terminal of an adjacent previous stage of shift register unit;

except a last stage of shift register unit, the first signal output terminal of each stage of shift register unit is connected to the first signal input terminal of an adjacent next stage of shift register unit.

17. The display device of claim 16, wherein the first signal input terminal of the zeroth stage of shift register unit inputs a frame start signal STV; and the second signal input terminal of the last stage of shift register unit inputs the frame start signal STV.

18. The display device of claim 16, wherein except the zeroth stage of shift register unit and the last stage of shift register unit, each stage of shift register unit further comprises: a second pull-up module, a second scanning module, a third pull-down module and a fourth pull-down module;

wherein the second pull-up module receives a second clock signal, is connected to a second control node and a second signal output terminal, and is used for pulling up a signal output from the second signal output terminal to a high level under the control of the second scanning module and the second clock signal;

the second scanning module receives the first scanning signal and the second scanning signal, is connected to a third signal input terminal, a fourth signal input terminal and the second control node, and is used for determining a scanning direction under the control of the first scanning signal and the second scanning signal, and for controlling a potential at the second control node according to signals input from the third and fourth signal input terminals;

the control module is further connected to the second control node, the third pull-down module, and the fourth pull-down module, and is used for controlling the third pull-down module and the fourth pull-down module according to the first AC signal and the second AC signal; and the third and fourth pull-down modules are further connected to the second control node, the second signal output terminal and the voltage terminal, and are used for pulling down a signal output from the second signal output terminal alternately under the control of the control module, except the zeroth stage of shift register unit and the last stage of shift register unit, the first signal output terminal of each stage of shift register unit is connected to the second signal input terminal of an adjacent previous stage of shift register unit, and the second signal output terminal of each stage of shift register unit is connected to the fourth signal input terminal of the adjacent previous stage of shift register unit; and except the zeroth stage of shift register unit and the last stage of shift register unit, the first signal output terminal of each stage of shift register unit is connected to the first signal input terminal of an adjacent next stage of shift register unit, and the second signal output terminal of each stage of shift register unit is connected to the third signal input terminal of the adjacent next stage of shift register unit.

19. The display device of claim 18, wherein the first signal input terminal of the zeroth stage of shift register unit inputs a frame start signal STV; and the second signal input terminal of the last stage of shift register unit inputs the frame start signal STV.

* * * * *